United States Patent [19]

Yamakido

[11] 4,366,439
[45] Dec. 28, 1982

[54] PCM DECODER

[75] Inventor: Kazuo Yamakido, Hachioji, Japan

[73] Assignee: Hitachi, Ltd., Tokyo, Japan

[21] Appl. No.: 185,805

[22] Filed: Sep. 10, 1980

[30] Foreign Application Priority Data

Sep. 10, 1979 [JP] Japan .................. 54-115299

[51] Int. Cl.³ .......................................... H03K 9/00
[52] U.S. Cl. ........................... 329/104; 340/347 DA;
375/25; 375/94
[58] Field of Search ........................ 329/104–107;
375/25, 94, 96; 340/347 DA

[56] References Cited

U.S. PATENT DOCUMENTS

| | | | |
|---|---|---|---|
| 2,991,422 | 7/1961 | Yaeger | 329/104 X |
| 3,594,782 | 7/1971 | Carbrey | 340/347 DA |
| 3,705,359 | 12/1972 | Kappes | 329/104 |
| 3,803,502 | 3/1974 | Pillot et al. | 329/104 |
| 4,186,383 | 1/1980 | Höfflinger et al. | 340/347 DA |

*Primary Examiner*—Siegfried H. Grimm

*Attorney, Agent, or Firm*—Antonelli, Terry & Wands

[57] ABSTRACT

A PCM decoder for converting to an analog voice signal an 8-bit PCM signal the first bit of which is a polarity specifying bit, the PCM decoder comprising a capacitor array having binary-weighted capacitors and a resistor string circuit having plural resistors for dividing a reference voltage to obtain different tap voltages, wherein the tap voltages corresponding to the four lower bits of the PCM signal are derived from the resistor string circuit and the combination of the reference voltage and each of the tap voltages, made according to the contents of the second, third and fourth bits of the PCM signal is applied to the corresponding one of the capacitors in the capacitor array circuit whereby the capacitor array circuit delivers an analog voltage signal corresponding to the received signal, the resistor string circuit having two groups of intermediate taps so that the conversion characteristic for obtaining voltages in the signalling frame may be different from that in the non-signalling frame.

4 Claims, 7 Drawing Figures

FIG. 5

| R | $\overline{B5}$ | $\overline{B6}$ | $\overline{B7}$ | $\overline{B8}$ | $\overline{SIG}$ | SIG |
|---|---|---|---|---|---|---|
| 1 | * | * | * | * | X0 | X0 |
| 0 | 0 | 0 | 0 | 0 | X0 | X1 |
| 0 | 0 | 0 | 0 | 1 | X2 | |
| 0 | 0 | 0 | 1 | 0 | X4 | X5 |
| 0 | 0 | 0 | 1 | 1 | X6 | |
| 0 | 0 | 1 | 0 | 0 | X8 | X9 |
| 0 | 0 | 1 | 0 | 1 | X10 | |
| 0 | 0 | 1 | 1 | 0 | X12 | X13 |
| 0 | 0 | 1 | 1 | 1 | X14 | |
| 0 | 1 | 0 | 0 | 0 | X16 | X17 |
| 0 | 1 | 0 | 0 | 1 | X18 | |
| 0 | 1 | 0 | 1 | 0 | X20 | X21 |
| 0 | 1 | 0 | 1 | 1 | X22 | |
| 0 | 1 | 1 | 0 | 0 | X24 | X25 |
| 0 | 1 | 1 | 0 | 1 | X26 | |
| 0 | 1 | 1 | 1 | 0 | X28 | X29 |
| 0 | 1 | 1 | 1 | 1 | X30 | |

FIG. 6

| R | $\overline{B2}$ | $\overline{B3}$ | $\overline{B4}$ | $Y_0$ | $Y_1$ | $Y_2$ | $Y_3$ | $Y_4$ | $Y_5$ | $Y_6$ | $Y_7$ | $Y_8$ |
|---|---|---|---|---|---|---|---|---|---|---|---|---|
| 1 | * | * | * | 1 | 1 | 1 | 1 | 1 | 1 | 1 | 1 | 1 |
| 0 | 0 | 0 | 0 | 3 | 1 | 1 | 1 | 1 | 1 | 1 | 1 | — |
| 0 | 0 | 0 | 1 | 2 | 3 | 1 | 1 | 1 | 1 | 1 | 1 | — |
| 0 | 0 | 1 | 0 | 2 | 2 | 3 | 1 | 1 | 1 | 1 | 1 | — |
| 0 | 0 | 1 | 1 | 2 | 2 | 2 | 3 | 1 | 1 | 1 | 1 | — |
| 0 | 1 | 0 | 0 | 2 | 2 | 2 | 2 | 3 | 1 | 1 | 1 | — |
| 0 | 1 | 0 | 1 | 2 | 2 | 2 | 2 | 2 | 3 | 1 | 1 | — |
| 0 | 1 | 1 | 0 | 2 | 2 | 2 | 2 | 2 | 2 | 3 | 1 | — |
| 0 | 1 | 1 | 1 | 2 | 2 | 2 | 2 | 2 | 2 | 2 | 3 | — |

PCM DECODER

BACKGROUND OF THE INVENTION

This invention relates to a PCM (pulse code modulation) decoder for voice signals used in telephony, and more particularly to a PCM decoder whose circuit is well adapted for an LSI configuration.

With the recent advance in semiconductor technology, a circuit element fabricated in an IC or LSI configuration, has come to possess high precision and high performance and therefore further development of LSI to be used in telecommunications has been greatly demanded to decrease cost and to improve performance in the field concerned. Typical examples are an encoder for converting an analog voice signal to a PCM signal and a decoder for performing the opposite conversion. If these devices are miniaturized by LSI techniques and therefore become less expensive, a so-called single channel coding system in which both the coding and decoding functions are incorporated in every voice channel will become more practical. Hence, the design of a communication system may exhibit a high versatility.

In the case where a PCM encoder for voice transmission by telephone is used to transmit signals such as dial pulses or monitor pulses, so-called A and B signals are inserted in the eighth bit positions of the eight-bit data in signalling frames allotted to the sixth and the twelfth frames in the standard data format including such two signalling frames and the other ten non-signalling or information frames. Accordingly, a PCM decoder for telephone voice must be provided with a special decoding function, e.g. signalling function, or, what is called, bit stealing for compensating the degradation of signal-to noise power ratio (S/N) due to the reduction in number of voice data bits when the data is derived from the signalling frame.

SUMMARY OF THE INVENTION

One object of this invention is to provide a PCM decoder which has such a signalling function as described above and whose circuit is well adapted for an IC or LSI configuration.

Another object of this invention is to provide a PCM decoder capable of decoding $\mu$-law encoded PCM signals regulated in the recommendation: Rec. G771 by the CCITT (International Telegraph and Telephone Consulative Committee).

According to this invention, which has been made to attain the above objects, there is provided a PCM decoder comprising a first circuit for receiving in series input PCM signals and outputting in parallel the PCM signals; a second circuit for delivering first and second control signals in accordance with the contents of the parallel output PCM signals; a third circuit including first to eighth capacitors whose capacitances are binary-weighted in ratio and each of which has two ends, one end connected with an output line and the other end connected selectively with one of plural voltage supply lines through the corresponding one of switches controlled by the first control signal; and a fourth circuit having a resistor string circuit and switches controlled by the second control signal, the resistor string circuit being provided with plural intermediate taps for taking out divided portions of the voltage developed thereacross, the voltage at one of the intermediate taps being applied to one of said voltage supply lines through one of the second-mentioned switches so that an analog voltage corresponding to the PCM signal is delivered from the output line of the third circuit, wherein the resistor string circuit has a first group of intermediate taps from which decoding voltages for the non-signalling frames are derived and a second group of intermediate taps from which decoding voltages for the signalling frames are derived and wherein the second circuit is responsive to the signalling frame signal to deliver the second control signal to select one of the intermediate taps of the first and second groups in accordance with the signalling frame signal.

The foregoing and other objects, advantages, manner of operation and novel features of the present invention will be understood from the following detailed description when read in connection with the accompanying drawings.

BRIEF DESCRIPTION OF THE DRAWINGS

FIG. 5 shows a logic table illustrating the relationship between the operation of the switch group in the resistor string circuit and the decoded PCM signals.

FIG. 6 shows a logic table illustrating the relationship between the operation of the switch group in the capacitance array circuit and the decoded PCM signals.

DESCRIPTION OF THE PREFERRED EMBODIMENT

Figure 1:
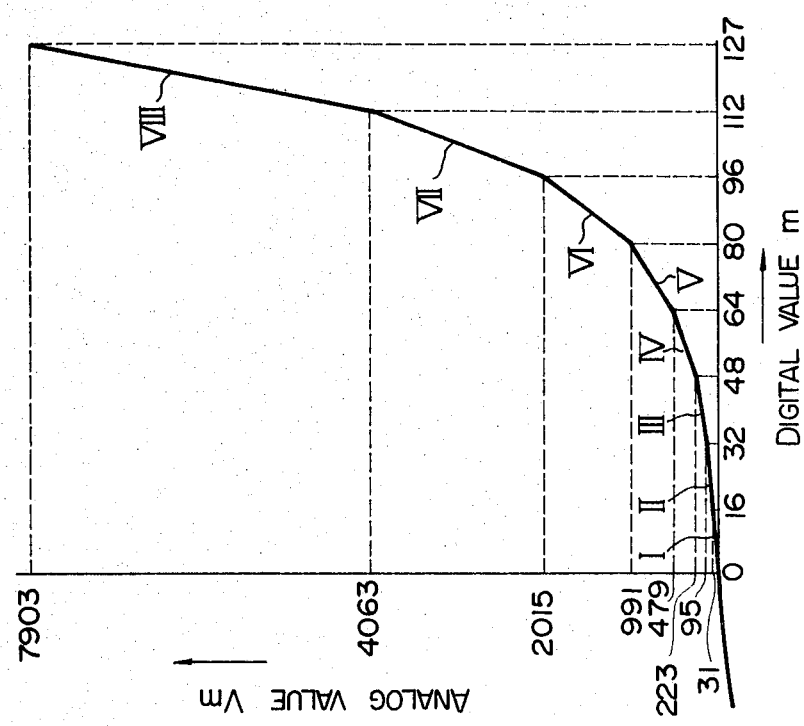
FIG. 1 shows the positive polarity portion of a quantizing characteristic of compressed signal in the $\mu$-law PCM coding.

FIG. 1 shows the positive polarity portion of the quantizing characteristic of a compressed signal in the $\mu$-law PCM coding with $\mu = 255$. In the illustrated case, the whole characteristic including the positive and negative portions is approximated by a broken line having fifteen line segments or chords.

That is, in the illustrated quantizing characteristic of a compressed signal, each of the positive and the negative portions is divided into eight line segments I–VIII, each segment being divided into 16 steps except for the first segment which is divided into $15\frac{1}{2}$ steps according to the quantization of the mid-tread mode. Further, in every two adjacent segments, the analog value corresponding to each step in one segment distant from the origin is twice as large as that corresponding to each step in the other segment.

In a PCM encoder, an analog voice signal is converted to a digital code having 8 bits ($B_1$–$B_8$) in accordance with the above quantizing characteristic. In this case, the first bit ($B_1$) is used to indicate the polarity of the signal, the second to the fourth bits ($B_2$–$B_4$) are used to specify in binary representation one of the segments I–VIII, and the fifth to the eighth bits ($B_5$–$B_8$) are used to specify one of the steps in the segment specified by the $B_2$ to $B_4$ bits.

Figure 2:
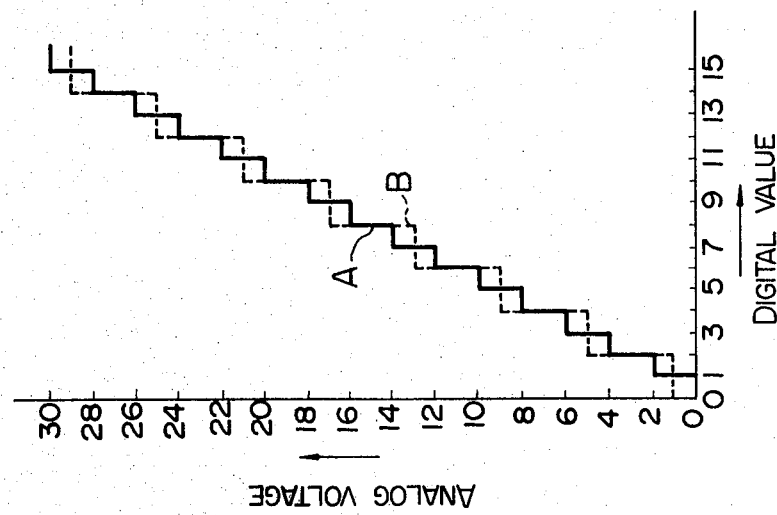
FIG. 2 shows the difference between the decoded voltages in the signalling and non-signalling frames.

The PCM decoder according to this invention has a capacitor array circuit including eight capacitors $C_0$–$C_7$ whose capacitances are proportionally binary-weighted and a resistor string circuit including a plurality of series resistors each having a resistance of R, 2R or 3R, for deriving different voltages by dividing a reference voltage. A voltage corresponding to the lower four bits $B_5$–$B_8$ of a received data block is produced by the resistor string circuit. The voltage produced by the resistor string circuit and the reference voltage are applied to selected capacitors, respectively, in the capacitor array circuit determined according to the contents of the second to the fourth bits $B_2$–$B_4$ of the received data block thereby producing an analog voltage corresponding to the received data block from the capacitor array circuit. In this case, the resistor string circuit is provided with two groups of intermediate taps to produce voltages according to the characteristic A shown in FIG. 2 for the data derived from the non-signalling frames and voltages according to the characteristic B in FIG. 2 for the data derived from the signalling frames.

Figure 3:
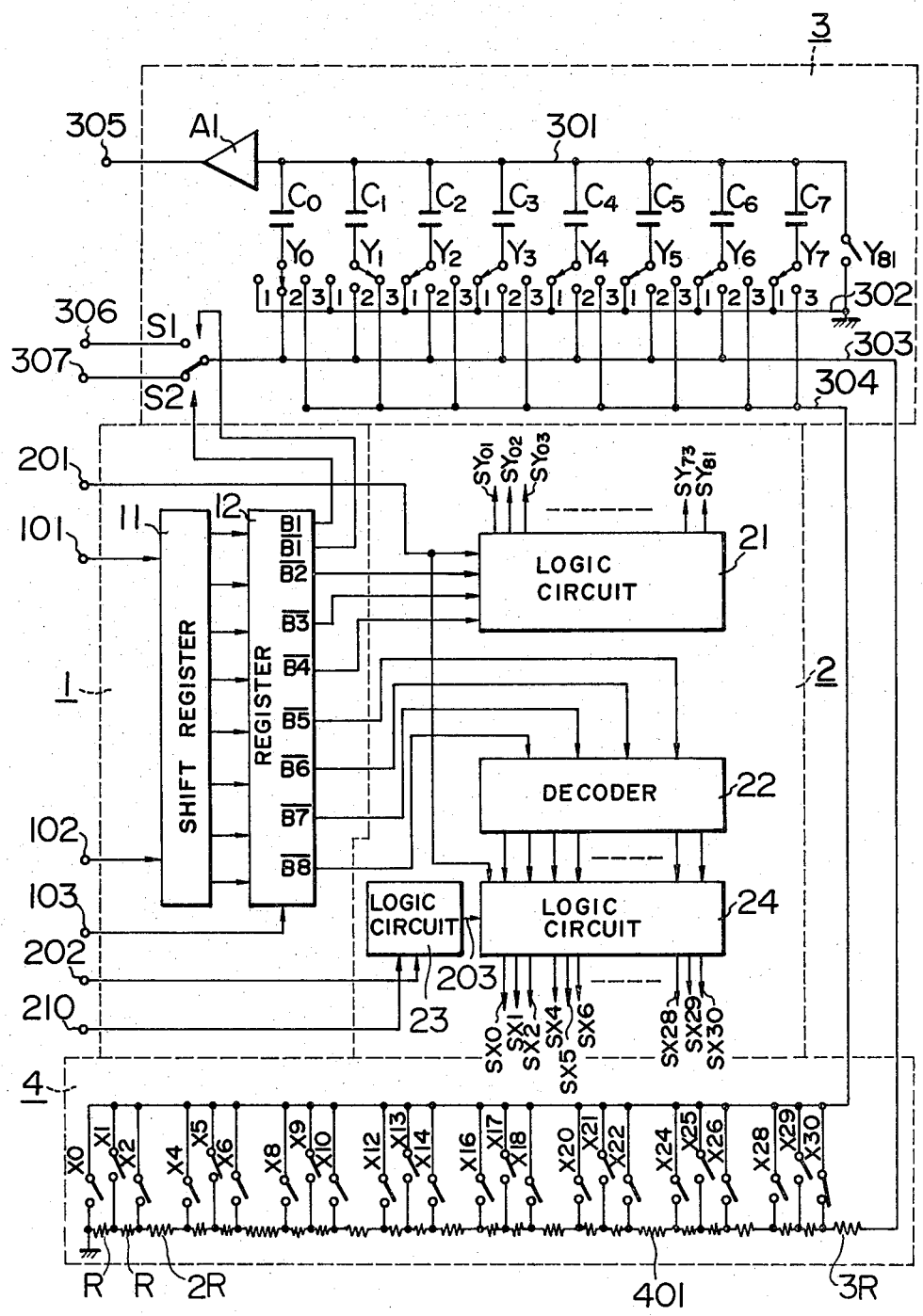
FIG. 3 shows a circuit of a PCM decoder in an embodiment of this invention.
Figure 4:
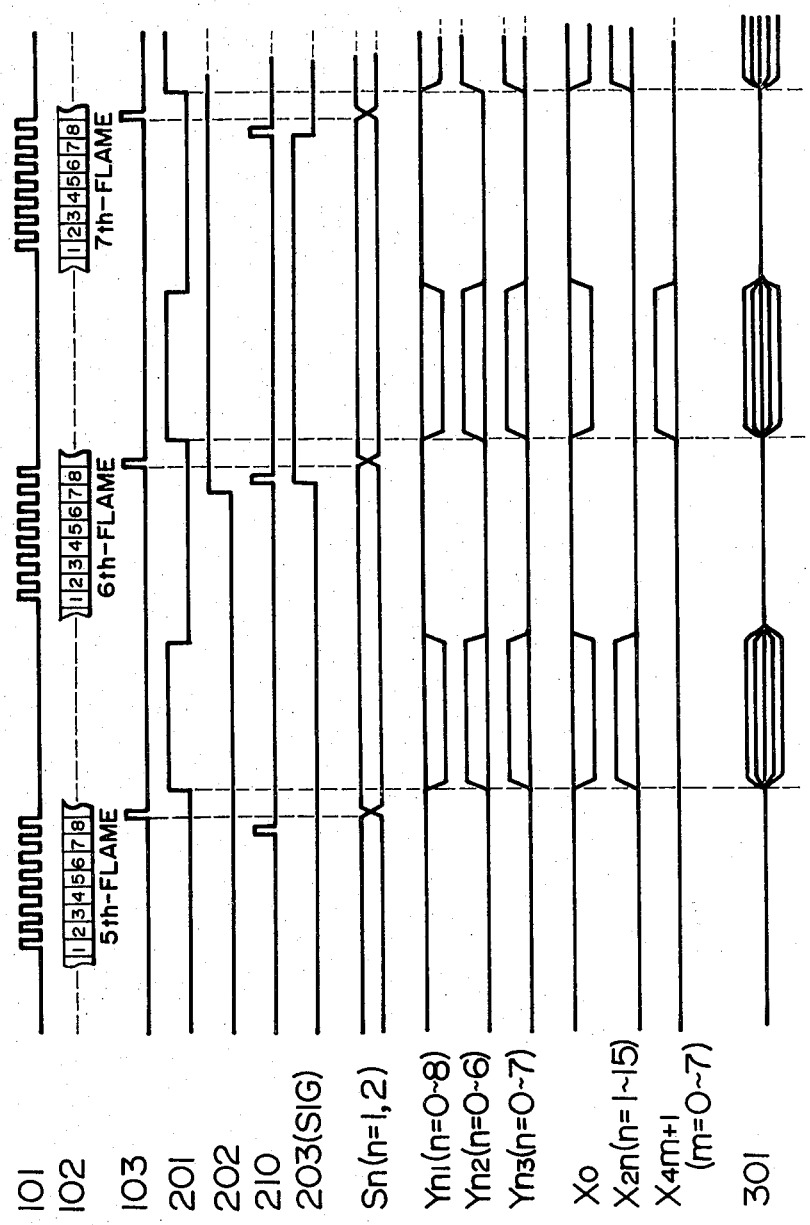
FIG. 4 shows waveforms of signals useful in explaining the circuit shown in FIG. 3.

Now, the circuit in an embodiment of this invention, shown in FIG. 3, will be described with the aid of FIG. 4 showing the waveforms of the signals appearing at various points in the circuit.

The PCM decoder shown in FIG. 3 generally comprises four circuit sections.

The first circuit section 1 comprises an 8-bit serial-input/parallel-output shift register 11 and an 8-bit parallel-input/parallel-output register 12. PCM bit signals applied to the terminal 102 are serially taken in the shift register 11 in response to a clock pulse signal received at the terminal 101. The contents of the shift register 11 are then parallely transferred to the register 12 in response to a latch pulse received at the terminal 103, and delivered as a parallel signal of 8 bits from the register 12. In this case, the logic levels of the 2nd to 8th bits ($B_2$–$B_8$) in the output of the register 12 are inverted.

The second circuit section 2 serves to control the turn-on and -off of analog switches connected to the capacitor array circuit in the third circuit section 3 and of analog switches connected to the resistor string circuit in the fourth circuit section 4 in accordance with the output of the first circuit section 1. More particularly, in the second circuit section 2, a circuit 21 delivers on-off control signals $SY_{01}$–$SY_{81}$ to control the analog switches $Y_{01}$, $Y_{02}$, $Y_{03}$,–$Y_{07}$ in third circuit section 3 according to the logical information corresponding to the 2nd to 4th bits $\overline{B_2}$–$\overline{B_4}$ in the output of the register 12 and a reset signal 201 which makes valid the logical outputs from the register 12 for a suitable period of time sufficient to have the logic circuits 21 and 24 performing their logical processes. A circuit 22 is a four-to-sixteen line decoder which receives 4-bit logical information corresponding to the 5th to 8th bits $\overline{B_5}$–$\overline{B_8}$ of the output of the register 12 and delivers a signal at one of 16 output lines corresponding to the decimal value represented by the 4-bit logical information. The circuit 23 serves to generate a signalling selection information (SIG) 203 upon receiving a signalling frame signal applied to the terminal 202. As shown by waveform 202 in FIG. 4, the signalling frame signal is a pulse which rises shortly before the eighth bit of the sixth frame of the PCM signal is received and falls shortly before the eighth bit of the twelfth frame of the PCM signal is received.

Figure 7:
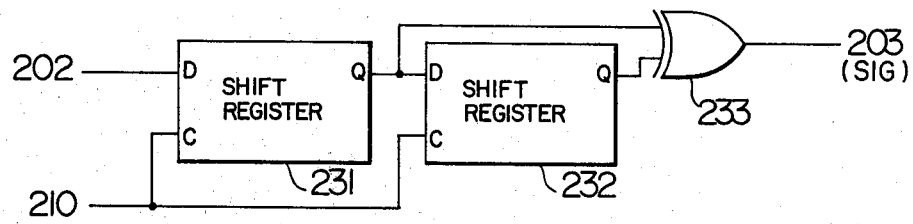
FIG. 7 shows in detail a circuit arrangement of the logic circuit 23 in FIG. 3.

The circuit 23 comprises, as shown in FIG. 7, a first shift register 231 which is conditioned under the presence of the signalling frame signal 202 to produce a high level at its output Q in synchronism with a pulse 210 produced with the eighth bit in each of the frames and under the absence of the signalling frame signal 202 to produce a low level at its output Q in synchronism with such a pulse 210, a second shift register 232 which is conditioned under the presence of the high level output Q of the first shift register 231 to produce a high level at its output Q in synchronism with the pulse 210 and under the presence of the low level output Q to produce a low level at its output Q in synchronism with the pulse 210, and an exclusive OR gate 233 which produces a pulse (SIG) 203 under the condition of exclusive OR of the high level outputs Q of the first and second shift registers 231 and 232. As mentioned before, the signalling frame signal 202 rises shortly before the eighth bit of the sixth frame and falls shortly before the eighth bit of the twelfth frame and hence the SIG pulse is produced at each of the 6th and 12th frames. The logic circuit 24 is rendered operative with the reset signal 201 to deliver signals $SX_0$–$SX_{30}$ for on-off control of the analog switches $X_0$–$X_{30}$ in the fourth circuit section 4 according to the outputs of the circuits 22 and 23.

The third circuit section 3, which delivers an analog voltage, comprises a capacitor array having a group of binary-weighted capacitors $C_0$–$C_7$ having capacitances in ratio of $2^0:2^1:2^2: \ldots :2^7$, respectively, and a buffer amplifier $A_1$. One end of each of these capacitors $C_0$–$C_7$ is connected with the input terminal of the buffer amplifier $A_1$ through an output line 301 while the other ends of these capacitors are connected respectively through a first group of switches $Y_{01}$–$Y_{71}$ with a first common line 302 and through a third group of switches $Y_{03}$–$Y_{73}$ with a third common line 304. Also, the other ends of the capacitors $C_0$–$C_6$ are connected through a second group of switches $Y_{02}$–$Y_{62}$ with a second common line 303.

The first common line 302 is at the ground potential, while the output line 301 is grounded when the switch $Y_{81}$ is closed. The second common line 303 is connected through switches $S_1$ and $S_2$ with terminals 306 and 307 to which the positive and negative reference voltages ($+V_{ref}$) and ($-V_{ref}$) are applied, respectively, and these switches $S_1$ and $S_2$ are on-off controlled by the first bit (polarity bit) output $B_1$ or $\overline{B_1}$ of the PCM signal delivered by the register 12.

The fourth circuit section 4 comprises a resistor string circuit 401 having 23 intermediate taps, and which circuit has its one end connected with the second common line 303 of the third circuit section 3 and the other end grounded, and a group of 24 switches $X_0$–$X_{30}$. The input end of the switch $X_0$ is connected with the ground potential, while the input ends of the remaining switches $X_1$–$X_{30}$ are connected with the intermediate taps, respectively. The output ends of these 24 switches are connected in common with the third common line 304 of the third circuit section 3 and these switches are classified into two groups according to the usage thereof. First group comprises switches $X_{2n}$ for providing voltages $2n/33\ V_{ref}$ where $n=0$–15 and the second group comprises switches $X_{4m+1}$ for providing voltages $4m+1/33\ V_{ref}$, where $m=0$–7, where the potential $V_{ref}$ is a positive or negative potential given at the non-grounded end of the register string circuit 401 having a total resistance of 33R through the second common line 303. The first group of switches are used for non-signalling periods, that is, for decoding the PCM signal in the non-signaling frames, i.e. the 1st to 5th frames and the 7th to 11th frames, while the second group of switches are used for signalling period, that is, for decoding the PCM signal in the 6th and 12th frames. The on-off operation of these switches is controlled by the logic output signals $SX_0$-$SX_{30}$ of the logic circuit 24. The modes of on-off control are shown in a logic table in FIG. 5. When the rest signal 201 in FIG. 4 is at the low level, the switch $X_0$ is turned on for both signalling and non-signalling periods, irrespective of the logic information $\overline{B5}$-$\overline{B8}$ so that an output having an analog level of 0V is delivered onto the third common line 304. When the reset signal 201 is at the high level only one switch selected according to the logic information of $\overline{B5}$-$\overline{B8}$ is turned on. For example, where $[\overline{B5}, \overline{B6}, \overline{B7}, \overline{B8}]=[0100]$ or $[0101]$, the output voltage to the common line 304 is 8 or 10, respectively, for the non-signalling period, while both 9 for the signalling period.

On the other hand, the on-off of the switches in the third circuit section 3 is controlled by the logic output signals $SY_{01}$-$SY_{81}$ of the logic circuit 21 according to the logic table shown in FIG. 6. Namely, in the reset state, all the first switches $Y_{n1}$ (n=0-8) are turned on irrespective of the logic information of $\overline{B2}$-$\overline{B4}$. When the reset state is canceled, and the logic information stands, for example, $[\overline{B2}, \overline{B3}, \overline{B4}]=[101]$, the switches $Y_{20}$, $Y_{21}$, $Y_{22}$, $Y_{32}$, $Y_{42}$, $Y_{53}$, $Y_{61}$ and $Y_{71}$ are turned on and all the other switches are turned off.

With the above described circuit configuration, the fourth circuit section 4 delivers, according to the logic information of B5-B8, onto the common line 304 a voltage of $2n/33\ V_{ref}$ (n=0-15) for the non-signalling period and a voltage of $4m+1/33\ V_{ref}$ (m=0-7) for the signalling period. Moreover, the third circuit section 3 can produce, according to the logic information of B2-B4, at the output terminal 305 a voltage of $$\left[\frac{\sum_{i=0}^{k-1} 2^i}{\sum_{i=0}^{7} 2^i} + \frac{2^k}{\sum_{i=0}^{7} 2^i} \times \frac{2n}{33}\right].$$

$V_{ref}$, where k=0-7 and n=0-15, for the non-signalling period and a voltage of $$\left[\frac{\sum_{i=0}^{k-1} 2^i}{\sum_{i=0}^{7} 2^i} + \frac{2^k}{\sum_{i=0}^{7} 2^i} \times \frac{4m+1}{33}\right].$$

$V_{ref}$, where k=0-7 and m=0-7, for the signalling period.

According to the above described decoder embodying this invention, the precision of the analog voltage delivered is determined depending on the relative accuracy of capacitances of the capacitors $C_0$-$C_7$ and the relative accuracy of tap intervals of the resistor string circuit. Since such relative accuracy depends only on the accuracy in dimensions on plane of an IC pattern, an analog voltage having a sufficiently high precision can be obtained.

I claim:

1. A PCM decoder comprising
   a first circuit for receiving in series input PCM signals forming signalling frames and non-signalling frames and for outputting in parallel the PCM signals;
   a second circuit for delivering first and second control signals in accordance with the contents of said parallel output PCM signals;
   a third circuit including first to eighth binary-weighted capacitors each having two ends, one end being connected with an output line and the other end connected selectively with one of plural voltage supply lines through a corresponding one of a first plurality of switches controlled by said first control signals; and
   a fourth circuit having a voltage source and a resistor string circuit which is provided with plural intermediate taps for taking out divided portions of a voltage of said voltage source so that the voltage at one of said intermediate taps may be applied to one of said voltage supply lines through one of a second plurality of switches controlled by said second control signals; an analog voltage corresponding to said PCM signal being delivered onto the output line of said third circuit, wherein said resistor string circuit has a first group of intermediate taps from which a decoding voltage for said parallel PCM signals corresponding to the non-signalling frames is derived and a second group of intermediate taps from which a decoding voltage for said parallel PCM signals corresponding to the signalling frames is derived and wherein said second circuit receives signalling frame signals and also delivers said second control signals to select one of said intermediate taps of said first and second groups in accordance with the content of said signalling frame signals.

2. A PCM decoder as claimed in claim 1, wherein said voltage supply lines of said third circuit comprise a first common line kept at the ground potential, a second common line to which either a positive or a negative reference voltage is selectively applied from said voltage source, and a third common line to which a voltage is applied from one of said intermediate taps and wherein said other ends of said 1st to 8th capacitors are connected with said first common line through said first plurality of switches and also with said third common line through a third plurality of switches while said other ends of said 1st to 7th capacitors are connected with said second common line through said second plurality of switches.

3. A PCM decoder as claimed in claim 2, wherein said resistor string circuit is connected between said second common line and said ground potential and said intermediate taps of said first group respectively give voltages of 2n/33 times the voltage developed across said resistor string circuit, where n is equal to 0 to 15 while said intermediate taps of said second group respectively provide voltages of 4m+1/33 times the voltage developed across said resistor string circuit, where m is equal to 0 to 7.

4. A PCM decoder as claimed in claim 1, 2 or 3, wherein said PCM signal includes 8 bits, the first of which is a polarity specifying bit and said second circuit includes a first logic circuit for delivering said first control signals in accordance with the contents of the 2nd to 4th bits of said PCM signal, and a second logic circuit for delivering said second control signals in accordance with said signalling frame signals and the contents of the 5th to 8th bits of said PCM signal.

* * * * *